(12) United States Patent
Raisigel et al.

(10) Patent No.: US 11,300,601 B2
(45) Date of Patent: Apr. 12, 2022

(54) ARC FAULT DETECTION USING SINGLE CURRENT SENSOR AND WIDEBAND ANALOG FRONTEND

(71) Applicant: Schneider Electric USA, Inc., Andover, MA (US)

(72) Inventors: Hynek Raisigel, Saint Egrève (FR); Gary W. Scott, Mount Vernon, IA (US); Michel Layour, Saint Laurent en Beaumont (FR); Andi Jakupi, Marion, IA (US)

(73) Assignee: Schneider Electric USA, Inc., Boston, MA (US)

( * ) Notice: Subject to any disclaimer, the term of this patent is extended or adjusted under 35 U.S.C. 154(b) by 398 days.

(21) Appl. No.: 16/009,620

(22) Filed: Jun. 15, 2018

(65) Prior Publication Data

US 2019/0386478 A1 Dec. 19, 2019

(51) Int. Cl.
| | |
|---|---|
| *H02H 3/46* | (2006.01) |
| *G01R 31/12* | (2020.01) |
| *G01R 19/00* | (2006.01) |
| *G01R 19/12* | (2006.01) |
| *H02H 1/00* | (2006.01) |
| *G01R 31/52* | (2020.01) |

(52) U.S. Cl.
CPC ..... *G01R 31/1272* (2013.01); *G01R 19/0007* (2013.01); *G01R 19/12* (2013.01); *G01R 31/52* (2020.01); *H02H 1/0015* (2013.01); *H02H 3/46* (2013.01)

(58) Field of Classification Search
CPC ..... H02H 1/0015; H02H 1/0023; H02H 3/105
See application file for complete search history.

(56) References Cited

U.S. PATENT DOCUMENTS

| | | | | |
|---|---|---|---|---|
| 3,859,579 | A * | 1/1975 | Plunkett | H02P 27/08 |
| | | | | 318/805 |
| 6,259,996 | B1 | 7/2001 | Haun | |
| 6,414,829 | B1 * | 7/2002 | Haun | H01H 71/125 |
| | | | | 361/42 |
| 6,477,021 | B1 * | 11/2002 | Haun | H02H 1/0015 |
| | | | | 361/42 |
| 6,567,250 | B1 | 5/2003 | Haun | |

(Continued)

OTHER PUBLICATIONS

International Search Report for PCT Application No. PCT/US2019/035893, dated Oct. 17, 2019, 4 pages.

(Continued)

*Primary Examiner* — Peter M Novak
(74) *Attorney, Agent, or Firm* — Locke Lord LLP

(57) ABSTRACT

Systems and methods for detecting an arc fault in a circuit breaker use a single-coil current rate of change (di/dt) sensor for monitoring both low frequency alternating current (AC) and broadband high frequency noise on a power line. The di/dt sensor is optimized to amplify any broadband high frequency noise, typically from about 1 MHz to 40 MHz, that may be present on the power line. Low frequency signals representing the current being monitored, typically from about 1 Hz to 10 KHz, is provided to an active integrator circuit with a high gain to enable the single-coil sensitivity. To shorten capacitor charge up time of the active integrator circuit, a charging current is provided to the active integrator circuit upon startup of the circuit breaker.

18 Claims, 7 Drawing Sheets

(56) References Cited

U.S. PATENT DOCUMENTS

| | | |
|---|---|---|
| 6,822,547 B2 * | 11/2004 | Saito .................... H01F 38/30 |
| | | 336/200 |
| 9,025,287 B2 | 5/2015 | Privitera et al. |
| 9,577,420 B2 | 2/2017 | Ostrovsky et al. |
| 9,716,379 B2 | 7/2017 | Miller et al. |
| 2003/0074148 A1 | 4/2003 | Dvorak |
| 2008/0055795 A1 | 3/2008 | Miller |
| 2008/0204949 A1 | 8/2008 | Zhou |
| 2009/0267704 A1 * | 10/2009 | Chang .................... H03H 1/02 |
| | | 333/175 |
| 2010/0157486 A1 * | 6/2010 | Parker ................ H02H 1/0015 |
| | | 361/2 |
| 2011/0273812 A1 * | 11/2011 | Beer ...................... F02D 41/20 |
| | | 361/152 |
| 2012/0119751 A1 | 5/2012 | Scott |
| 2016/0202321 A1 | 7/2016 | Drame |
| 2016/0334454 A1 | 11/2016 | Lentz |
| 2019/0199080 A1 * | 6/2019 | Schmalz ................ H02H 3/26 |

OTHER PUBLICATIONS

Writen Opinion of the International Searching Authority for PCT Application No. PCT/US2019/035893, dated Oct. 17, 2019, 5 pages.

\* cited by examiner

ARC FAULT DETECTION USING SINGLE CURRENT SENSOR AND WIDEBAND ANALOG FRONTEND

FIELD OF THE INVENTION

The embodiments disclosed herein relate generally to electronic circuit breakers and particularly to circuit breakers that employ a single current sensor to detect arc faults.

BACKGROUND OF THE INVENTION

Detection of an arc fault generally requires monitoring low frequency current and high frequency noise current in an AC power line usually generated by the arc fault. The low frequency signals help to confirm an arc fault is present in existing power line being monitored as well as to determine the correct trip time limit as a function of arc fault current. Arc fault current is a very important parameter for arc fault detection, and trip time limit values are specified in the international standard requirements for arc fault detection devices.

The current trend in arc fault detection technology is to focus on high frequency noise in the 1 MHz to 40 MHz range. There are two main reasons to monitor this broadband frequency range. First, monitoring in this frequency range minimizes any loading effect on other devices that may be present on the AC power line. Second, good signal propagation (e.g., 50 m) has been observed in this frequency range, in addition to the range being generally unused on AC power lines. Thus, frequencies in this range can travel (and hence be detected) through the power line wire network of a home without significant degradation.

Existing electronic circuit breakers and other circuit interruption devices that include arc fault detection functionality, known as AFCI (arc fault circuit interrupt) or AFDD (arc fault detection device), typically employ two current sensors. One current sensor is used to monitor the high frequency noise and a separate second current sensor is used to monitor low frequency signals. The use of independent high frequency and low frequency current sensors has a number of benefits. For example, each current sensor may be optimized for a different frequency range to ensure the sensor outputs a sufficiently strong signal for the desired range.

In most electronic circuit breakers, the current sensor is a current transformer. This current transformer may be optimized for detection of low frequency signals (e.g., by using a high number of secondary winding turns), or it may be optimized for detection of high frequency noise (e.g., by using a ferrite core and a low number of secondary winding turns).

However, having two current transformers presents several design challenges. For one thing, two current transformers occupy twice as much space, making it difficult to incorporate both of them inside an already crowded electronic circuit breaker. This is especially true for miniature circuit breakers (MCB) where internal spacing is extremely constrained. As well, the AC line current being monitored by the current transformer must pass through both transformers, which can present additional mechanical complexity within the circuit breaker.

Instead of a current transformer, a di/dt current sensor, also called a "current rate of change" sensor or "current rise time" sensor by those skilled in the art, may also be used. However, a di/dt sensor provides an output signal, which is a voltage signal, that is proportional to the rate of change of its input signal, usually line current. A high frequency signal has a higher rate of change than a low frequency signal, so the di/dt sensor amplifies high frequency signals more than it amplifies low frequency signals.

The low gain of the di/t sensor at low frequencies can be increased in some cases by using a higher number of secondary winding turns. However, using a high number secondary turns, particularly in a compact winding, can increase parasitic capacitive coupling between the turns, causing them to appear as a short-circuit to high frequency signals. This capacitive coupling can limit the frequency bandwidth of the di/dt sensor, so a di/dt sensor needs to have a more spread out secondary winding in order to provide a broad bandwidth. But a spread out secondary winding is difficult to achieve within a cramped space like inside a circuit breaker.

Another issue is the low gain can cause the low frequency output of the di/dt sensor to fall below the noise floor and resolution limit of many analog-to-digital converters (ADC). A typical high frequency di/dt sensor may generate an output signal of less than 100 µV for a low frequency signal like a 1 A, 50/60 Hz line current. The 100 µV output signal, however, would not register with a typical 12-bit ADC, which has a resolution limit of 732 µV (3 V/212=732 µV, assuming a supply voltage of 3 V). On top of that, the output for the low frequency signal may be masked by the output for high frequency noise, which is more strongly amplified by the di/dt sensor.

One way to overcome the masking by the high frequency noise is to use a very high resolution ADC, for example, a delta-sigma ADC with 20-bit resolution. However, the high resolution of the delta-sigma ADC generally prevents it from being incorporated within a noisy environment like a microcontroller, especially if signal integration time is constrained by higher sampling rate requirements (e.g., >10 Ksps). And a discrete delta-sigma ADC having the necessary high resolution and sampling rate would be too expensive for most AFDD/AFCI applications.

A more efficient and cost effective solution is to provide an active integration circuit with a high gain at the output of the di/dt sensor. However, the output of the active integration circuit depends on the previous input to the circuit, which in this case is the output of the di/dt sensor. This presents a problem because power for the active integration circuit and various electrical components in a circuit breaker is not available until the circuit breaker is turned on. Furthermore, during the startup period, there is a transient on the active integration circuit output that could lead to uncontrolled pre-charging of the circuit's integrating capacitor. As a result, the output of the active integration circuit is not stable immediately after startup and does not become stable for a certain amount of time thereafter. Consequently, the response of the circuit breaker, specifically the arc fault detection function therein, may be delayed, causing tripping of the circuit breaker in response to an arc fault condition to be delayed during startup.

Accordingly, a need exists for a way to implement arc fault detection in circuit breakers and other circuit interruption devices that overcomes the limitations of existing solutions.

SUMMARY OF THE DISCLOSED EMBODIMENTS

At a high level, the embodiments disclosed herein are directed to improved systems and methods for implementing arc fault detection in circuit breakers and other circuit interruption devices. The systems and methods provide an arc fault detection circuit that uses a single current sensor for monitoring both high frequency noise and low frequency signals on an AC power line. The current sensor may be a di/dt current sensor in some embodiments, also known as a current rate of change sensor or a current rise time sensor. The di/dt current sensor is preferably a compact transformer with a compact ferrite core and a low number of secondary winding turns, as low as 1-30 turns in some embodiments. The use of a compact, single current sensor for monitoring both high frequency noise and low frequency signals makes for a smaller and more cost effective AFCI/AFDD solution that is easier to integrate into a circuit breaker or other circuit interruption application, especially where space is limited.

In some embodiments, the di/dt current sensor may be specifically optimized to sense broadband high frequency noise, which may range from about 1 MHz to about 40 MHz. For example, a Rogowski coil may be used as a broadband high frequency current sensor in some embodiments. The broadband high frequency di/dt sensor has a strong output in the presence of high frequencies on the AC power line, but a weak output in the presence of low frequencies (about 1 Hz to about 10 KHz) on the AC power line. Therefore, in some embodiments, an active integrator circuit may be provided at the output of the sensor to boost any low frequency outputs. In these embodiments, the active integrator circuit may have a charge storage element that regulates operation of the active integrator circuit. A charging current may be supplied to the charge storage element immediately or shortly after startup of the arc fault detection circuit to expedite initial charging of the charge storage element. This helps more quickly stabilize the active integrator circuit after startup.

In some embodiment, the charging current may be implemented using a microprocessor or microcontroller unit (MCU) having at least one general purpose input/output (GPIO) pin. The GPIO pin may be a tristate pin that can be used to output the charging current during the charging interval, but is otherwise in a high impedance state. As alluded to above, the charging current speeds up the operational availability of the active integrator circuit in the arc fault detection circuit and allows the circuit to correctly detect a fault condition more quickly after startup. Such an arrangement advantageously combines optimized broadband noise detection with strong low frequency signal amplification without increasing circuit breaker size or reducing system startup time.

In general, in one aspect, the disclosed embodiments are directed to a method for detecting arc faults in a circuit breaker. The method comprises, among other things, receiving a broadband high frequency signal from a single broadband current rise time sensor circuit, and receiving a low frequency signal from the single broadband current rise time sensor circuit in parallel with the broadband frequency signal. The method further comprises detecting an arc fault based either on the broadband frequency signal or the low frequency signal and tripping the circuit breaker upon detection of the arc fault.

In general, in another aspect, the disclosed embodiments are directed to an arc fault detection device. The arc fault detection device comprises, among other things, a single broadband current rise time sensor circuit having a sufficient number of secondary windings to amplify a broadband high frequency signal, and a bandpass filter circuit connected to the single broadband current rise time sensor circuit and configured to pass the broadband high frequency signal. The arc fault detection device further comprises an active integrator circuit connected to the single broadband current rise time sensor circuit and configured to amplify a low frequency signal, the active integrator circuit having a charge storage element therein, and a controller connected to the charge storage element of the active integrator circuit, the controller programmed to provide a charging current to the charge storage element for a charging interval upon startup of the controller. The controller is further connected to the bandpass filter circuit and the active integrator circuit and further programmed to detect an arc fault based on an output signal from either the bandpass filter circuit or the active integrator circuit.

In general, in still another aspect, the disclosed embodiments are directed to circuit breaker having an arc fault detection device as described herein, the circuit breaker further comprising a trip mechanism connected to the controller such that a trip signal from the controller actuates the trip mechanism.

BRIEF DESCRIPTION OF THE DRAWINGS

The foregoing and other advantages of the disclosed embodiments will become apparent upon reading the following detailed description and upon reference to the drawings, wherein.

DETAILED DESCRIPTION OF THE DISCLOSED EMBODIMENTS

As an initial matter, it will be appreciated that the development of an actual, real commercial application incorporating aspects of the disclosed embodiments will require many implementation specific decisions to achieve a commercial embodiment. Such implementation specific decisions may include, and likely are not limited to, compliance with system related, business related, government related and other constraints, which may vary by specific implementation, location and from time to time. While a developer's efforts might be considered complex and time consuming, such efforts would nevertheless be a routine undertaking for those of skill in this art having the benefit of this disclosure.

It should also be understood that the embodiments disclosed and taught herein are susceptible to numerous and various modifications and alternative forms. Thus, the use of a singular term, such as, but not limited to, "a" and the like, is not intended as limiting of the number of items. Similarly, any relational terms, such as, but not limited to, "top," "bottom," "left," "right," "upper," "lower," "down," "up," "side," and the like, used in the written description are for clarity in specific reference to the drawings and are not intended to limit the scope of the invention.

Figure 1:
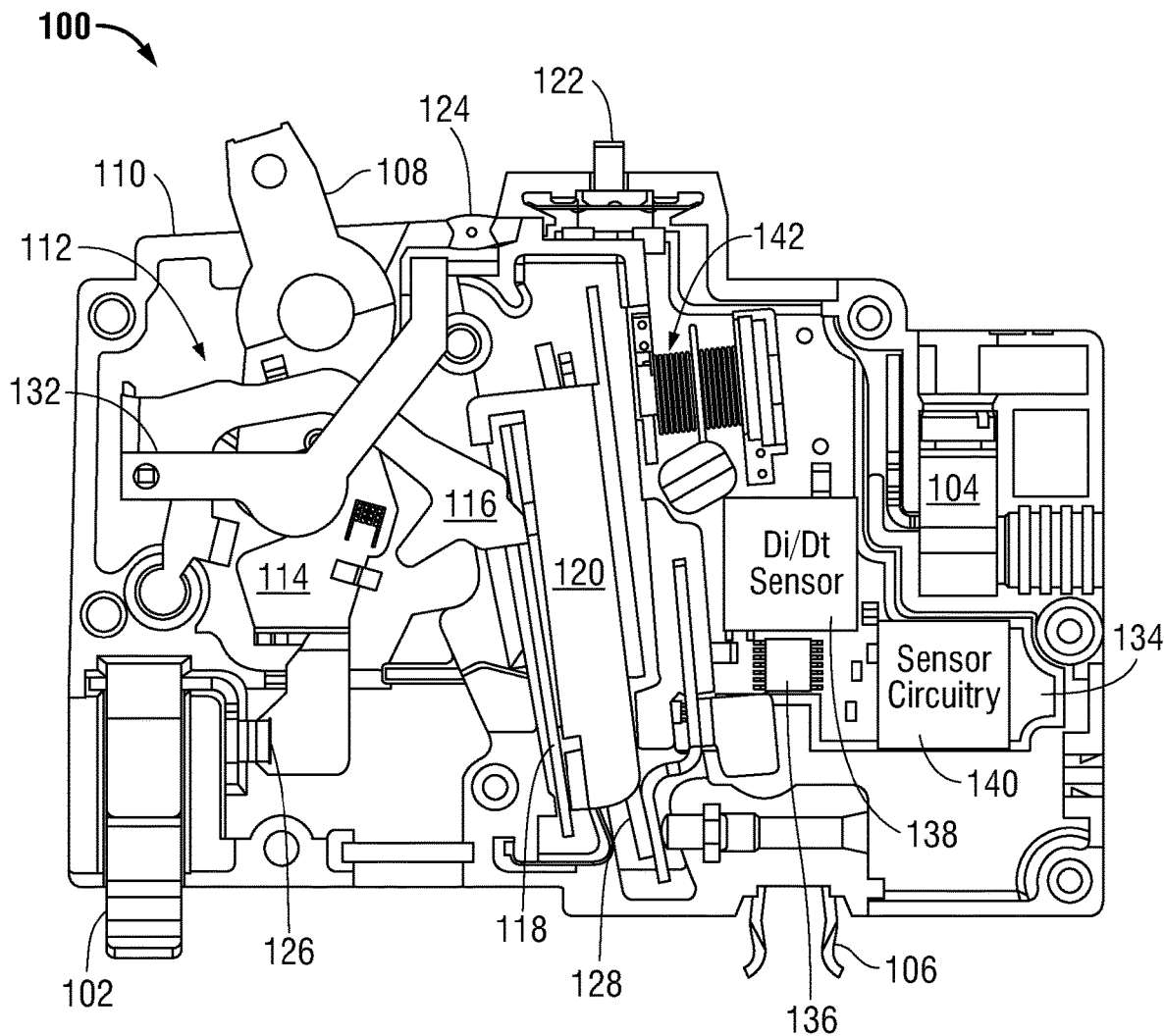
FIG. 1 illustrates a circuit breaker having an exemplary an arc fault detection circuit according to aspects of the disclosed embodiments.

Referring now to FIG. 1, a circuit breaker 100 for protecting an AC power line (not expressly shown) along with various circuit breaker components are shown according to the disclosed embodiments. As is typical, the circuit breaker 100 includes a power line terminal 102, a load terminal 104, and a neutral terminal 106. A handle 108 protruding from a casing 110 allows the circuit breaker 100 to be switched amongst an OFF state, an ON state, and a tripped state. The handle 108 engages a trip mechanism, indicated generally at 112, and may be used to set the trip mechanism 112 and thus the circuit breaker 100 according to one of the above states. The trip mechanism 112 may include, among other things, a rotating contact arm 114, a spring biased trip lever 116, a latch plate 118, and a metallic yoke 120. A push-to-test button 122 protruding from the casing 110 allows a user to perform manual testing of the circuit breaker in a known manner. In some embodiments, a viewing window 124 in the casing 110 provides a visual indication of whether the circuit breaker is in the tripped state.

Operation of the circuit breaker 100 is well known in the art and is described only in general terms here. Generally, switching the handle 108 into the ON position (as shown) causes the spring biased trip lever 116 to be latched by the latch plate 118. With the trip lever 116 latched, the rotating contact arm 114 is free to rotate clockwise into contact with an electrical contact 126 connected to the power line terminal 102. The circuit breaker 100 is now ON. When there is an overcurrent, increased heat from the overcurrent causes a bimetal strip 128 to bend or deform in a clockwise direction, moving the yoke 120 and hence the latch plate 118 away from the trip lever 116. This releases the trip lever 116 to swing clockwise, forcing the contact arm 114 away from the electrical contact 126 and breaking the connection with the power line terminal 102. The circuit breaker 100 is now tripped. In a similar manner, a short-circuit current causes a coil (not shown) inside the yoke 120 to become magnetized, pulling the yoke 120 and the latch plate 118 away from the trip lever 116. This again trips the circuit breaker 100 as described above. When the circuit breaker 100 is thus tripped, a colored trip flag 132 moves into view of the viewing window 124 to inform the user that the circuit breaker 100 is tripped.

Note that although the circuit breaker 100 depicted in FIG. 1 is a single-pole circuit breaker, the principles and teachings disclosed herein are equally applicable to multi-pole circuit breakers. The circuit breaker 100 may also be any suitable circuit breaker type, including miniature circuit breakers "MCB" as well as molded case circuit breakers "MCCB." Regardless of the particular embodiment, it is contemplated that the circuit breaker 100 includes AFCI/AFDD functionality. In the example of FIG. 1, the AFCI/AFDD functionality is provided via a circuit board 134 having, among other things, an arc fault detection circuit for the circuit breaker 100. The arc fault detection circuit may comprise a number of discrete and integrated circuit components, including a controller 136 that provides operational logic for performing the arc fault detection.

In accordance with the disclosed embodiments, a single current sensor, generally indicated at 138, is provided on the circuit board 134 for performing the arc fault detection. The current sensor 138 may be a broadband di/dt sensor that has been optimized for sensing broadband high frequency noise, and may be a Rogowski coil in some embodiments. The Rogowski coil may be a discrete Rogowski coil or it may be a Rogowski coil printed on a PCB (printed circuit board) in some embodiments. Such a broadband di/dt sensor 138 generates a generally strong output when high frequency noise, about 1 MHz to about 40 MHz (+/−1 octave), is present on the AC power line, but a generally weak output when low frequency signals, about 1 Hz to about 10 KHz (+/−1 octave), are present on the power line.

Preferably the broadband di/dt sensor 138 is a compact sensor with a ferromagnetic core that has about 13 secondary winding turns (+/−12 turns) or less. Suitable di/dt sensors that may be used as the broadband di/dt sensor 138 are available from, for example, Magnetics, Inc., Arnold Magnetic Technologies, and similar manufacturers. While di/dt sensors having a higher number of secondary turns may be used, such sensors are typically limited to a bandwidth of a few hundred kilohertz. Their limited bandwidth prevents these current sensors from being used to monitor the broadband high frequency noise that can more reliably indicate occurrence of an arc fault.

Associated circuitry, generally indicated at 140, is provided on the circuit board 134 for processing the outputs generated by the broadband di/dt sensor 138. The associated circuitry 140 may include circuitry for processing the outputs resulting from the broadband high frequency noise as well as circuitry for processing the low frequency signals, as will be discussed further herein.

The outputs generated by the broadband di/dt sensor 138 from both the broadband high frequency noise and low frequency signals are thereafter used by the controller 136 in parallel to detect arc faults in a manner known to those skilled in the art. Examples of suitable controllers 136 may include a microcontroller (e.g., an ARM Cortex-M4), a digital signal processor (DSP), an ASIC device, and the like. Upon detection of an arc fault, the controller 136 energizes a trip solenoid 142, causing it to become magnetized and pull the metal yoke 120 and hence the latch plate 118 away from the trip lever 116, thereby tripping the circuit breaker 100.

Figure 2:
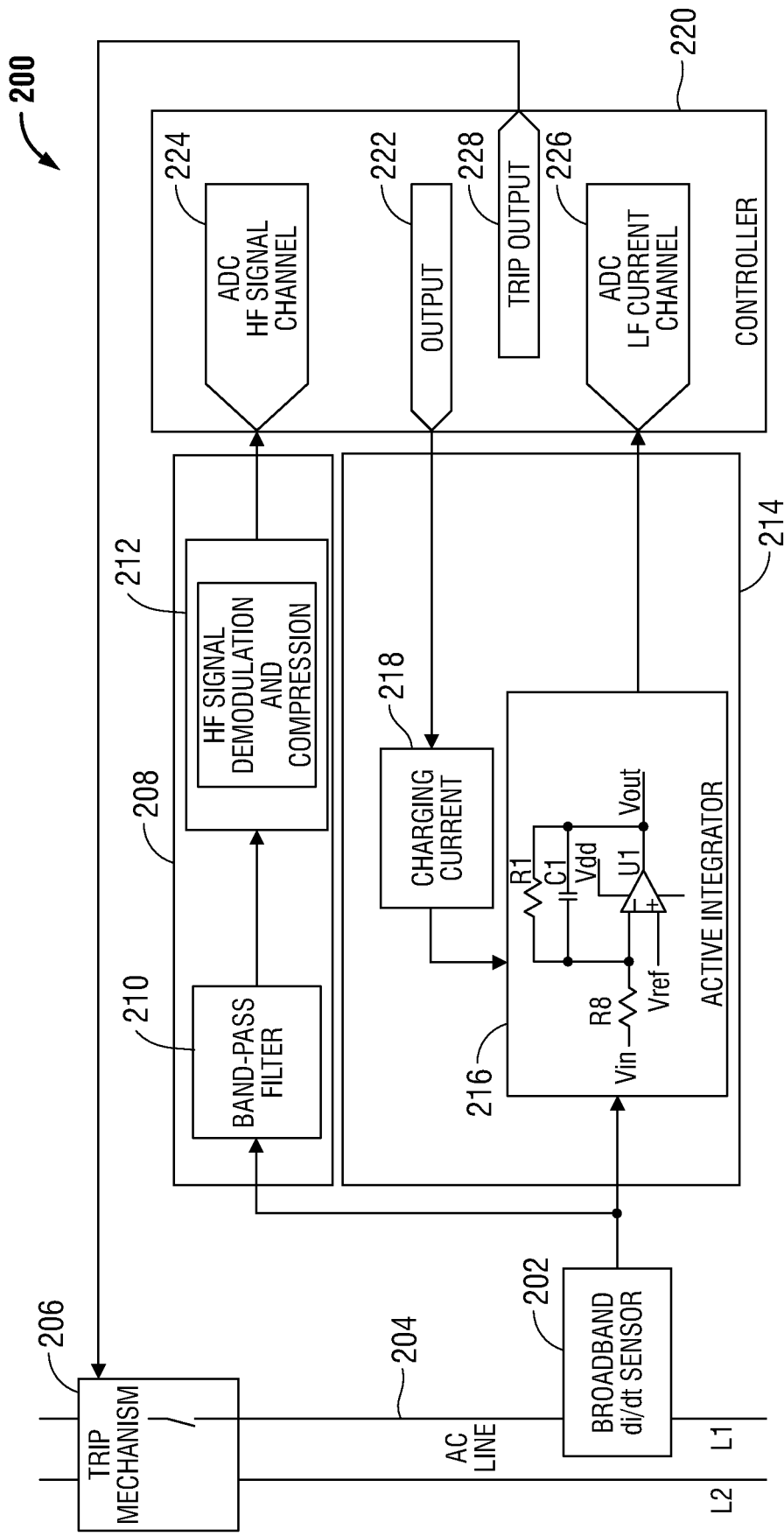
FIG. 2 illustrates an exemplary arc fault detection circuit according to aspects of the disclosed embodiments.

FIG. 2 illustrates a partial block diagram of an exemplary arc fault detection circuit 200 having a single broadband di/dt current sensor in accordance with the disclosed embodiments. The arc fault detection circuit 200 includes a single-coil di/dt current sensor 202 for monitoring both low frequency signals and broadband high frequency noise on an AC power line 204 (L1 and L2). As discussed above, the di/dt current sensor 202 is optimized to monitor broadband high frequency noise present on power line 204, and may be a Rogowski coil in some embodiments. Also shown is a trip mechanism 206 that operates to open-circuit the AC power line 204 upon detection of an arc fault by the arc fault detection circuit 200.

In the FIG. 2 example, the output of the di/dt current sensor 202 provides any broadband high frequency signal to broadband high frequency processing circuitry 208. This broadband high frequency processing circuitry 208 may include a high frequency band-pass filter 210 and a demodulation and compression circuit 212 in some embodiments. The high frequency band-pass filter 210 may be designed to pass frequencies in the 1 MHz to 40 MHz range in some embodiments, and the demodulation and compression circuit 212 may have a dynamic range compression feature in some embodiments. A logarithmic amplifier or a radio frequency (RF) amplifier with fast automatic gain control (AGC) may be used for the demodulation and compression circuit 212 in some embodiments. These components are generally well understood by those skilled in the art and therefore a detailed description is omitted here for economy of explanation purposes.

In addition to the broadband high frequency processing circuitry 208, the output of the di/dt current sensor 202 also provides any low frequency signals to low frequency processing circuitry 214. As the name suggests, the low frequency processing circuitry 214 is designed to amplify low frequency signals from the di/dt current sensor 202, typically in the 1 Hz to 10 KHz range. To that end, the low frequency processing circuitry 214 may include an active integrator circuit 216 having a high gain in some embodiments. The active integrator circuit 216 may be composed of an operational amplifier U1 having a voltage output Vout and two voltage inputs Vref and Vin. A number of discrete circuit elements may be connected to the operational amplifier U1 in a known manner, as shown, including a charge storage element, capacitor C1.

In accordance with the disclosed embodiments, a charging current 218 may be supplied to the active integrator circuit 216. The charging current 218 provides a way to quickly charge the charge storage element C1 immediately or shortly after startup of the arc fault detection circuit 200 (i.e., during its power-up sequence). This charging current 218 may be provided by a controller 220 through a tristate output 222 thereof, and may continue for a predefined charging interval lasting, e.g., about 1 ms. The tristate output 222, which may be a GPIO pin on the controller 220, may output a charging current of, e.g., about 20 µA for the duration of the charging interval, and is otherwise in a high impedance state. Such a charging current 218 speeds up charging of the charge storage element C1, thereby allowing the active integrator circuit 216 to become operationally available more quickly to the fault detection circuit 200.

The outputs of the broadband high frequency processing circuitry 208 and the low frequency processing circuitry 216 are thereafter provided to a high frequency signal channel 224 (e.g., an ADC thereof) and a low frequency signal channel 226 (e.g., an ADC thereof), respectively, of the controller 220. The controller 220 subsequently processes these outputs in parallel to detect occurrence of an arc fault in a manner known to those skilled in the art. Upon detection of an arc fault, the controller 220 issues a trip signal through a trip output 228 to the trip mechanism 206 to thereby open-circuit the AC power line 204.

Figure 3:
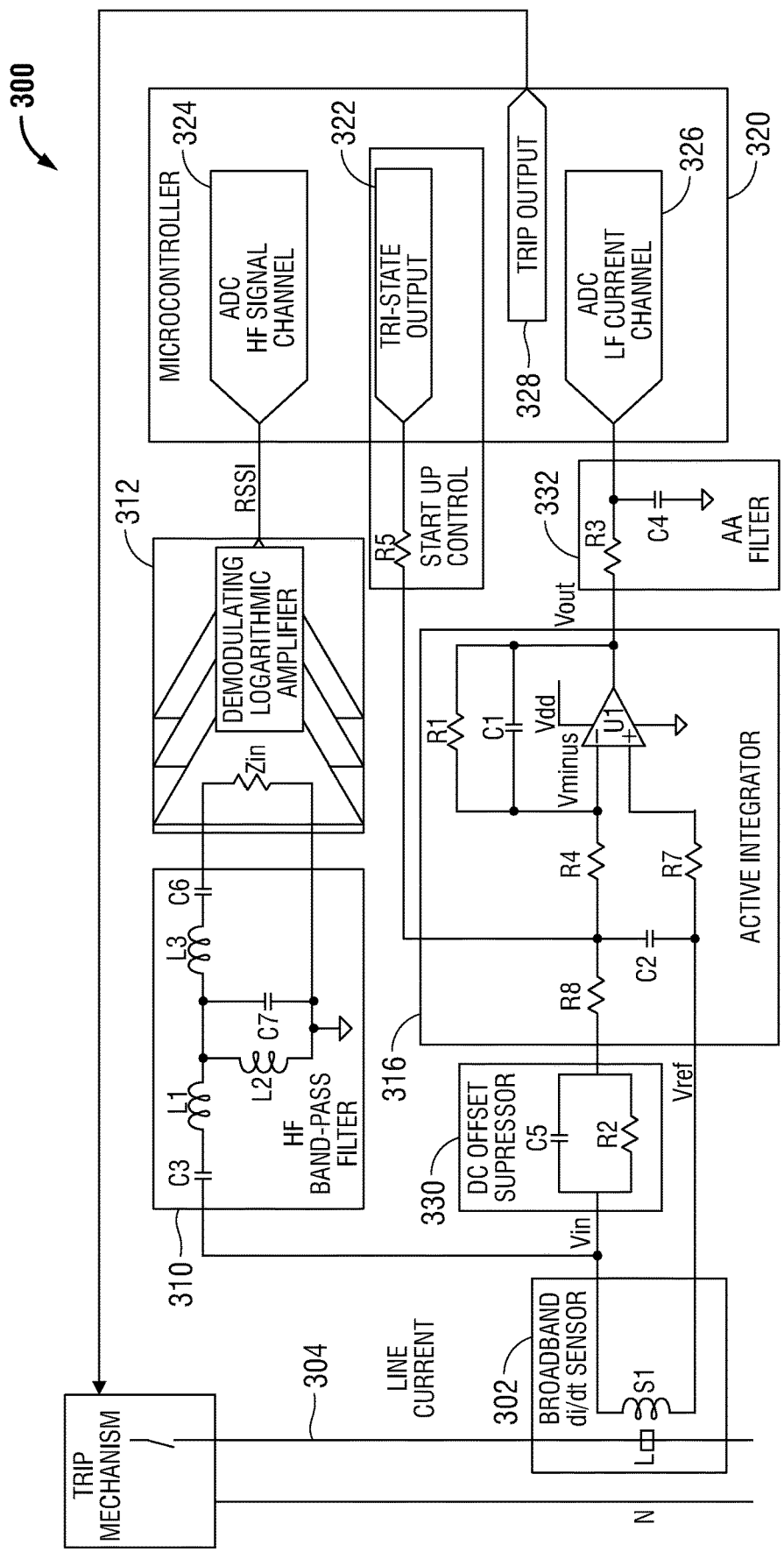
FIG. 3 illustrates another exemplary arc fault detection circuit according to aspects of the disclosed embodiments.

FIG. 3 illustrates a more specific implementation of an exemplary an arc fault detection circuit 300 according to the disclosed embodiments. The arc fault detection circuit 300 is similar to the arc fault detection circuit 200 from FIG. 2 insofar as there is a single broadband di/dt current sensor 302 being used to monitor both low frequency signals and broadband high frequency noise on an AC power line 304. As in the previous embodiment, the di/dt current sensor 302 is optimized to monitor broadband high frequency noise present on the power line 304, and is preferably a compact transformer with a compact ferrite core and a low number of secondary winding turns, as low as 1-30 turns in some embodiments. A microcontroller 320 again processes the output from the di/dt current sensor 302 to detect any arc faults on the AC power line 304. Upon detection of an arc fault, the microcontroller 320 issues a trip signal through a trip output 328 to a trip mechanism 306 to open-circuit the AC power line 304.

In the implementation of FIG. 3, a T-type high frequency band-pass filter 310 receives and processes any broadband high frequency signals from the di/dt current sensor 302. This T-type high frequency band-pass filter 310 may be any conventional T-type high frequency band-pass filter designed to pass high frequency signal, typically in the 1 MHz to 40 MHz range and preferably in the 10 MHz to 20 MHz range. The output of the T-type high frequency band-pass filter 310 is then provided to a demodulation logarithmic amplifier 312 for demodulation and compression. The demodulation logarithmic amplifier 312 demodulates and compresses the high frequency noise, and outputs a received signal strength indicator (RSSI) to a high frequency signal channel 324 (e.g., an ADC thereof) of the microcontroller 320 for arc fault detection. An anti-aliasing filter (not shown) may be connected between the logarithmic amplifier output and the ADC input in some embodiments.

At the other end of the spectrum, an active integrator circuit 316 receives and processes any low frequency signals from the di/dt current sensor 302, typically in the 1 Hz to 10 KHz range. As before, the active integrator circuit 316 may be any suitable operational amplifier U1 configured in a known manner to amplify low frequency signals from the di/dt current sensor 302. Various discrete circuit elements may the connected to the operational amplifier U1 as shown, including a charge storage element, capacitor C1. A charging current, e.g., about 20 µA (+/−10 percent), depending on the application, may then be supplied to the active integrator circuit 316 to quickly charge the storage element C1 immediately or shortly (i.e., less than 1 ms) after startup of the arc fault detection circuit 300. The charging current may be provided by the microcontroller 320 through a tristate output 322 for a predefined charging interval, e.g., about 1 ms, depending on the application. This arrangement expedites charging of the charge storage element C1, thus allowing the active integrator circuit 316 to become operationally available more quickly.

Once it becomes operationally available, the active integrator circuit 316 integrates and amplifies any low frequency signals at the di/dt sensor output to recover the AC current waveform masked by the stronger high frequency noise. The active integrator circuit 316 preferably has a low frequency gain that is proportional to a resistance seen in parallel with the charge storage element and an impedance seen in series with the charge storage element. For the embodiment of FIG. 3, the gain of the active integrator circuit 316 is set primarily by resistors R2 and equivalent resistance R8', as shown in Equation (1):

$$A = -\frac{R1}{R8'} \cdot \frac{1}{(1 + 2\pi f \cdot R1 \cdot C1)} \tag{1}$$

In the above equation, A is the gain of the active integrator circuit and R8' represents the sum of R8+R4+ReZ(C5∥R2), where ReZ(C5∥R2) is the real part of the impedance presented by the parallel combination of capacitor C5 and resistor R2 for a given frequency f Note that the active integrator circuit 316 has a corner integration frequency, $f_1=1/(R1*C1)$, below which the circuit works more like an inverting amplifier than an integrator. Resistor R1 and capacitor C1 should thus be chosen carefully based on the requirements of the particular application to account for the corner integration frequency. Note also that capacitor C2 and resistor R4 are optional components that operate to improve the high frequency stability of the circuit. When present, resistor R4 should have a significantly lower value than resistor R8 in order to avoid unintentionally modifying the gain of the circuit.

One issue that may affect the active integrator circuit 316 is the input offset voltage of operational amplifier U1 often generates a significant DC offset at the integrator output because the input offset voltage will be amplified by the R1/R8' term. This can cause unsymmetrical signal saturation in the operational amplifier, especially in case of high current values. Therefore, in some embodiments, a DC offset limiting circuit 330 may be disposed between the di/dt current sensor 302 and the active integrator circuit 316 to limit any unintended gain thereof due to the DC offset. The DC offset limiting circuit 330 may be composed of capacitor C5 and resistor R2 connected as shown, and operates to limit the gain of the active integrator circuit 316 at very low frequencies, e.g., much less (<<) than $f_1$, while allowing it to operate normally at higher frequency signals. Following are basic component sizing rules that may be used with the active integrator circuit 316: $1/(R2*C5)<<f_1=1/(R1*C1)<<$active integration bandwidth$<<1/(R8*C2)<<$GBWP, where GBWP is the gain-bandwidth product of the operation amplifier (i.e., the product of the amplifier bandwidth and the gain at which the bandwidth is measured).

The output Vout of the active integrator circuit 316 is then provided to a low frequency signal channel 326 (e.g., an ADC thereof) of the microcontroller 320 for arc fault detection. The microcontroller 320 uses the low frequency output from the active integrator circuit 316 in parallel with the broadband high frequency output from the bandpass filter 310 to detect occurrence of any arc fault on the AC power line 304. In some embodiments, an anti-aliasing filter 332 may be applied on all ADC input signals (only one filter shown in FIG. 3) to mitigate any aliasing that may occur on the signals.

One difference between a di/dt sensor and a current transformer involves the burden impedance connected to their outputs. With a current transformer, a low impedance burden must be applied, whereas a di/dt sensor requires a high-impedance burden. Thus, to ensure a high impedance burden for the disclosed di/dt sensor over the full monitored bandwidth, care should be taken to avoid inadvertently shorting the burden impedance in the operating frequency range of one channel by another parallel channel operating in a different frequency range. For this reason, a T-type bandpass filter is preferred for the bandpass filter 310 over its n-type equivalent, so as not to short-circuit the low frequency signals of the sensor. On the other hand, the active integrator input impedance in the high frequency range should be higher than the input impedance of the high frequency channel. This can be achieved by choosing the value of resistor R8 greater than the input impedance of the high frequency channel.

Figure 4:
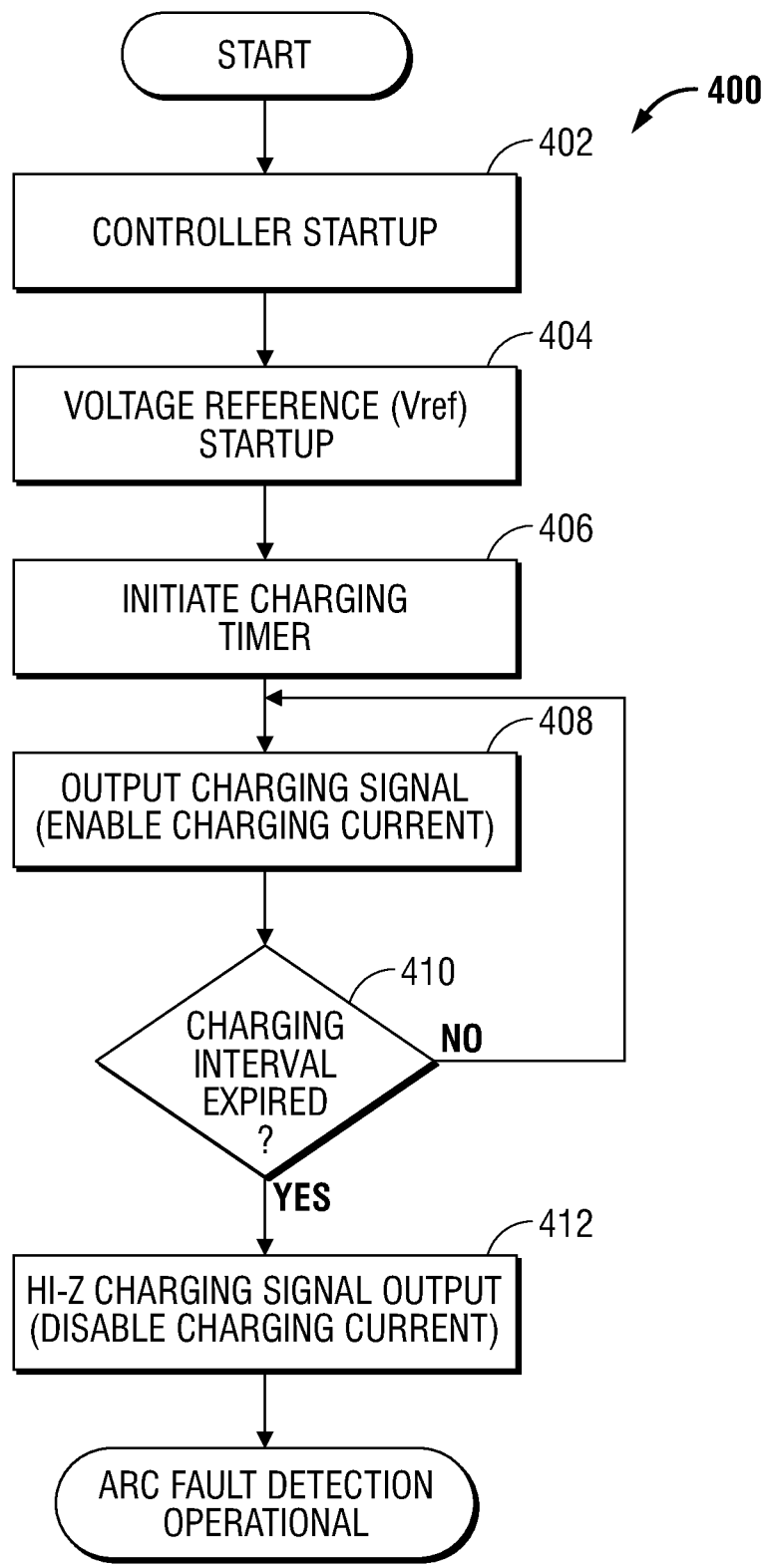
FIG. 4 illustrates an exemplary method that may be used with an arc fault detection circuit according to aspects of the disclosed embodiments.

FIG. 4 illustrates a flowchart 400 depicting a sequence or method that may be used by a controller in an arc fault detection circuit to speed up charging of an active integrator according to the disclosed embodiments. The particular method reflected in the flowchart 400 uses or is based on a predetermined fixed charging interval that may be determined experimentally, for example. The flowchart 400 generally begins at block 402 when the controller is initially powered on. Immediately or shortly after being powered on, the controller establishes a voltage reference Vref at one input of the active integrator at block 404, and initiates a charging timer at block 406 that has been preset to correspond to a predetermined charging interval. At block 408, the controller outputs a charging signal or otherwise enables a charging current at one of its output pin, preferably a tristate output pin. At block 410, the controller checks whether the charging timer has finished or ended, meaning the charging interval has expired. If the charging timer has not ended, then the controller returns to block 408 and maintains the charging current. If the charging timer has ended, then the controller puts the output pin into a high impedance mode at block 410. Arc fault detection becomes operational at this point and the controller proceeds as programmed.

Figure 5:
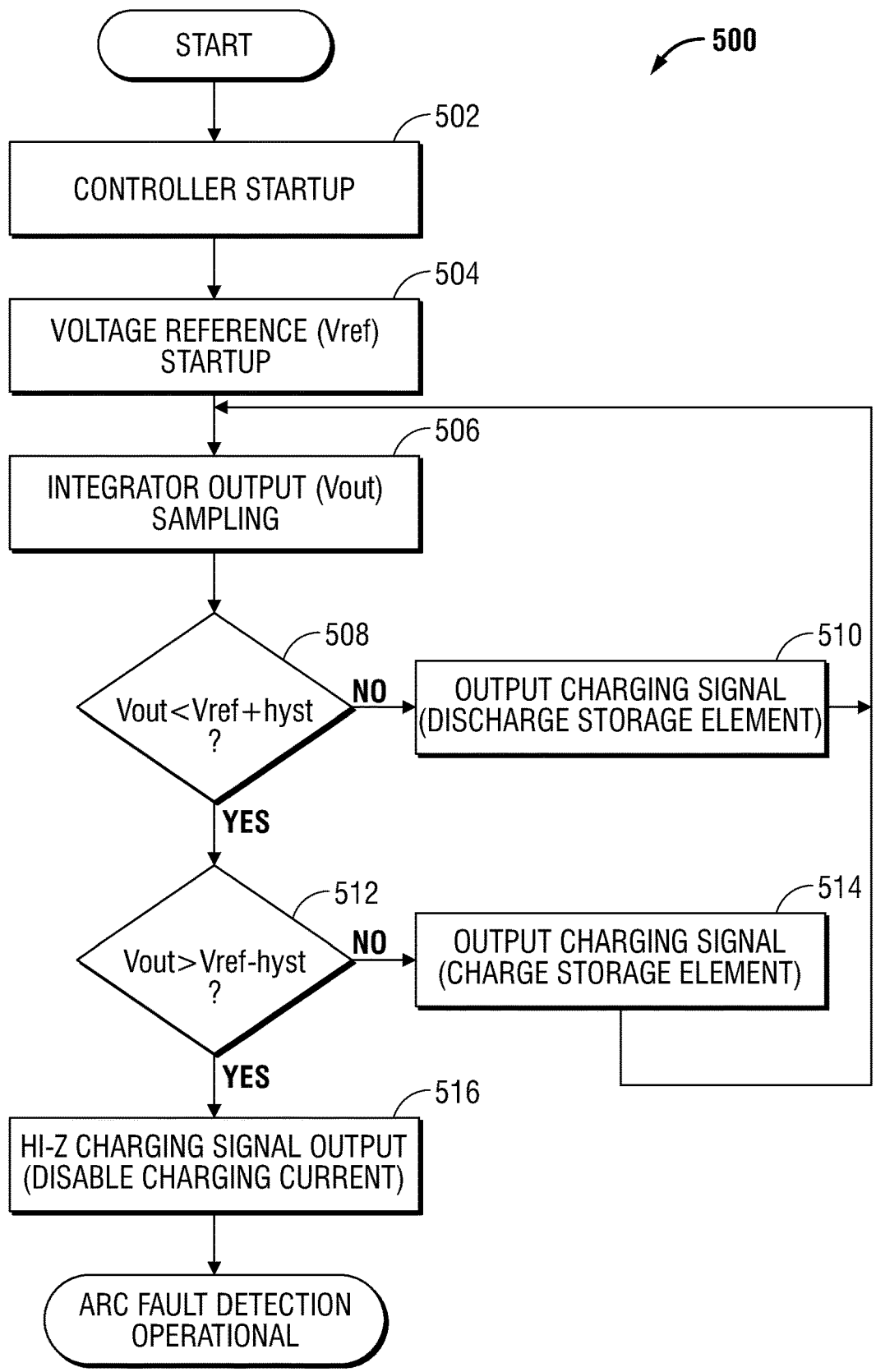
FIG. 5 illustrates another exemplary method that may be used with an arc fault detection circuit according to aspects of the disclosed embodiments.

FIG. 5 illustrates a flowchart 500 depicting an alternative sequence or method that may be used by a controller in an arc fault detection circuit to speed up charging of an active integrator according to the disclosed embodiments. The method of FIG. 5 involves an adaptive sequence that checks the active integrator output voltage in order to control charging current duration and polarity at startup. As before, the flowchart 500 generally begins at block 502 when the controller is initially powered on and immediately or shortly thereafter establishes the voltage reference Vref at block 504. At block 506, the output voltage Vout of the active integrator is sampled by the controller's ADC (to which the active integrator output is connected). Sampling may be done according to any suitable sampling scheme (e.g., sampling time, number of samples, etc.) known to those skilled in the art.

At block 508, a determination is made as to whether the output voltage Vout is less than the reference voltage Vref plus a small hysteresis or tolerance value. If the determination is no, then this means the voltage storage element (capacitor) of the active integrator has too much voltage and needs to be drained. In that case, the controller puts the tristate output pin into a high level in order to rapidly source current to the voltage storage element on the negative input side of the operational amplifier at block 510. This process is then repeated until the determination at block 508 is yes.

If the determination at block 508 is yes, then another determination is made at block 512 as to whether the output voltage Vout of the active integrator is higher than the reference voltage Vref minus a small hysteresis value. If the second determination is no, then this means the voltage storage element of the active integrator has too little voltage and needs to be charged. In that case, the controller puts the tristate output pin into a low level in order to rapidly sink current from the voltage storage element on the negative input side of the operational amplifier at block 514. This process is likewise repeated until the determination at block 512 is yes.

If the determination at block 512 is yes, then the controller puts the tristate charging output into high-impedance mode at block 516 in order not to interfere with the operation of active integrator. Arc fault detection is now available and the controller proceeds as programmed.

Figure 6:
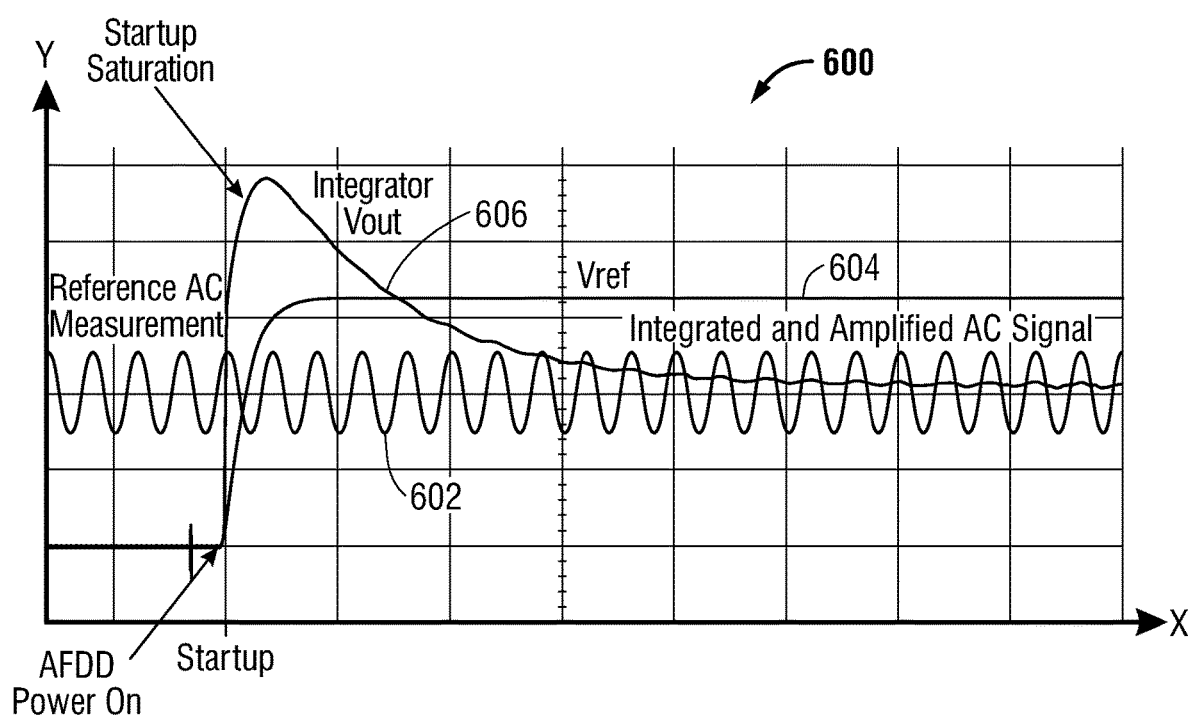
FIG. 6 illustrates exemplary waveforms for arc fault detection circuit without aspects of the disclosed embodiments.

FIG. 6 illustrates a graph 600 showing the startup of an arc fault detection circuit having an active integrator, but without any startup control or integrator capacitor pre-charge. In the graph 600, the vertical axis (Y) represents voltage, the horizontal axis (X) represents time, line 602 represents the AC current being monitored, line 604 represents the active integrator reference voltage Vref, and line 606 represents the active integrator output Vout. As can be seen, after startup when the arc fault detection circuit is first powered on, the integrator output Vout quickly saturates due to operational amplifier power-on transients and Vref settling time. The active integrator output Vout settling time is typically slow (e.g., 100 ms) due to a low corner integration frequency, $f_1$, and low feedback capacitor charging current. During this settling time, the response of the active integrator to the low frequency signal output from the di/dt sensor may be biased, which can inhibit the breaker protection characteristics. The active integrator does not become stable enough for arc fault detection until sometime later (not shown).

Figure 7:
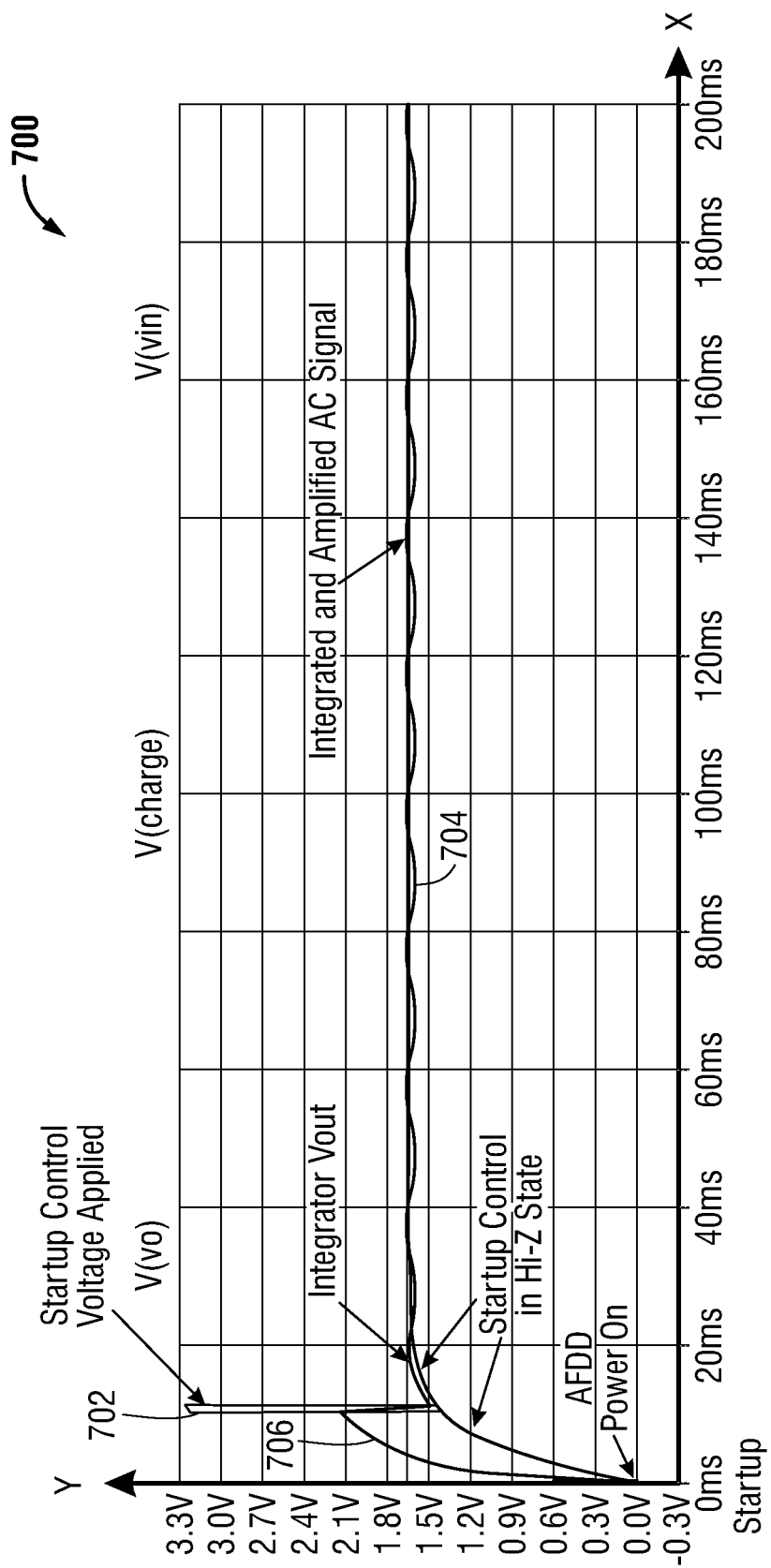
FIG. 7 illustrates exemplary waveforms for arc fault detection circuit according to aspects of the disclosed embodiments.

FIG. 7 illustrates a graph 700 showing the startup of an arc fault detection circuit having an active integrator, but this time with the controller performing a startup control and integrator capacitor pre-charge sequence. In the graph 700, the vertical axis (Y) again represents voltage, the horizontal axis (X) again represents time, while line 702 represents the charging current, line 704 represents the active integrator reference voltage Vref, and line 706 represents the active integrator output Vout. As before, after startup when the arc fault detection circuit is first powered on, the active integrator output Vout begins to saturate again due to operational amplifier power-on transients and Vref settling time. However, application of the charging current 702 to the integrator capacitor immediately or shortly after startup, in accordance with the disclosed embodiments, quickly brings the active integrator output Vout in line with the voltage reference Vref. As discussed earlier, the charging current may be supplied by a tristate output pin of the controller (in conjunction with resistors R5 and R4 in FIG. 3). Note that except during the short charging interval, the tristate output of the microcontroller remains in high-impedance mode so as not to interfere with the operation of the integrator circuit. The charging interval may be a predefined fixed amount of time that is determined experimentally (see FIG. 4) in some embodiments, or it may be a controlled sequence that includes sampling the active integrator output and using the sampled output as feedback to control the tristate output and timing (see FIG. 5) in some embodiments. In either case, as can be seen, the startup control scheme disclosed herein enables faster operational availability of the active integrator for arc fault condition detection on the power line being monitored.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the scope of the disclosed embodiments as defined in the appended claims.

What is claimed is:

1. An arc fault detection device, comprising:
    a single broadband current rise time sensor circuit having a sufficient number of secondary windings to amplify a broadband high frequency signal;
    a bandpass filter circuit connected to the single broadband current rise time sensor circuit and configured to pass the broadband high frequency signal;
    an active integrator circuit connected to the single broadband current rise time sensor circuit and configured to amplify a low frequency signal, the active integrator circuit having a charge storage element therein; and
    a controller connected to the charge storage element of the active integrator circuit, the controller programmed to drain voltage from the charge storage element upon startup of the controller in response to determining that an output signal from the active integrator circuit is less than a reference voltage plus a drain hysteresis value, the controller further programmed to provide a charging current to the charge storage element for a charging interval upon startup of the controller in response to determining that the output signal from the active integrator circuit is greater than the reference voltage minus a charge hysteresis value, the charging current charging the charge storage element to a non-zero voltage that is sufficient to stabilize operation of the active integrator circuit for the controller to detect an arc fault;
    wherein the controller is further connected to the bandpass filter circuit and the active integrator circuit and further programmed to detect an arc fault based on an output signal from either the bandpass filter circuit or the active integrator circuit.

2. The arc fault detection device of claim 1, wherein the broadband high frequency signal has a frequency between about 10 MHz and about 20 MHz and the low frequency signal has a frequency between about 1 Hz and about 10 KHz.

3. The arc fault detection device of claim 1, wherein the controller is connected to the charge storage element through a tristate output of the controller, the tristate output being in a high impedance state except during the charging interval upon startup of the controller.

4. The arc fault detection device of claim 1, wherein the charging interval is a predetermined fixed amount of time.

5. The arc fault detection device of claim 1, wherein the charging interval is determined by the controller as a function of an output voltage of the active integrator circuit relative to the reference voltage.

6. The arc fault detection device of claim 1, wherein the single broadband current rise time sensor circuit is one of: a Rogowski sensor, or a compact ferrite core sensor with less than 30 secondary winding turns.

7. The arc fault detection device of claim 1, wherein the active integrator circuit has a low frequency gain that is proportional to a resistance seen in parallel with the charge storage element and an impedance seen in series with the charge storage element.

8. The arc fault detection device of claim 1, wherein the bandpass filter is a T-type bandpass filter.

9. The arc fault detection device of claim 1, further comprising a high frequency signal demodulation and compression circuit connected between the bandpass filter circuit and the controller.

10. The arc fault detection device of claim 9, wherein the high frequency signal demodulation and compression circuit comprises a demodulating logarithmic amplifier.

11. A circuit breaker having an arc fault detection device according to claim 1, the circuit breaker further comprising a trip mechanism connected to the controller such that a trip signal from the controller actuates the trip mechanism.

12. A method for detecting arc faults in a circuit breaker, comprising:
    receiving a broadband high frequency signal from a single broadband current rise time sensor circuit;
    receiving a low frequency signal from the single broadband current rise time sensor circuit in parallel with the broadband frequency signal;
    detecting an arc fault based either on the broadband frequency signal or the low frequency signal; and
    tripping the circuit breaker upon detection of the arc fault;
    wherein the low frequency signal is received through an active integrator circuit, further comprising draining voltage from a charge storage element of the active integrator circuit upon startup of the circuit breaker in response to determining that an output signal from the active integrator circuit is less than a reference voltage plus a drain hysteresis value, and charging the charge storage element of the active integrator circuit for a charging interval of the active integrator circuit upon startup of the circuit breaker in response to determining that the output signal from the active integrator circuit is greater than a reference voltage plus a charge hysteresis value, the charging current charging the charge storage element to a non-zero voltage that is sufficient to stabilize operation of the active integrator circuit for detection of an arc fault.

13. The method of claim 12, wherein the charging interval is a predetermined fixed amount of time.

14. The method of claim 12, wherein the charging interval is determined as a function of an output of the active integrator circuit relative to the reference voltage.

15. The method of claim 12, wherein the low frequency signal includes a DC offset, further comprising suppressing the DC offset.

16. The method of claim 12, wherein the broadband high frequency signal is received though a bandpass filter circuit connected to the broadband current rise time sensor circuit.

17. The method of claim 16, further comprising demodulating and compressing the broadband high frequency signal, wherein the demodulating and compressing is provided by a high frequency signal demodulation and compression circuit.

18. An arc fault detection device, comprising:
   a single broadband current rise time sensor circuit having a sufficient number of secondary windings to amplify a broadband high frequency signal;
   a bandpass filter circuit connected to the single broadband current rise time sensor circuit and configured to pass the broadband high frequency signal;
   an active integrator circuit connected to receive an output of the single broadband current rise time sensor circuit at an input of the active integrator circuit and configured to amplify a low frequency signal in said output, the active integrator circuit having a charge storage element connected between the input of the active integrator circuit and an output of the active integrator circuit; and
   a controller connected to the charge storage element of the active integrator circuit, the controller programmed to provide a charging current to the charge storage element for a charging interval upon startup of the controller, the charging current charging the charge storage element to a non-zero voltage that is sufficient to stabilize operation of the active integrator circuit for the controller to detect an arc fault;
   wherein the controller is connected to the charge storage element via the input of the active integrator circuit through a tristate output of the controller, the tri state output being in a high impedance state except during the charging interval upon startup of the controller; and
   wherein the controller is further connected to an output of the bandpass filter circuit and the output of active integrator circuit and programmed to detect an arc fault based on an output signal from the output of either the bandpass filter circuit or the active integrator circuit.

* * * * *